United States Patent [19]

Steinlin

[11] Patent Number: 4,470,018
[45] Date of Patent: Sep. 4, 1984

[54] CIRCUIT FOR PRODUCING A CONTROL VOLTAGE DEPENDING ON FREQUENCY AND/OR PHASE DIFFERENCES

[75] Inventor: Walter Steinlin, Bolligen, Switzerland

[73] Assignee: Hasler AG Bern, Bern, Switzerland

[21] Appl. No.: 380,811

[22] PCT Filed: Sep. 25, 1981

[86] PCT No.: PCT/CH81/00106
§ 371 Date: May 21, 1982
§ 102(e) Date: May 21, 1982

[87] PCT Pub. No.: WO82/01289
PCT Pub. Date: Apr. 15, 1982

[30] Foreign Application Priority Data

Sep. 29, 1980 [CH] Switzerland .................. 7272/80

[51] Int. Cl.³ .................. H03D 13/00; H03L 7/08
[52] U.S. Cl. .................. 328/133; 328/149
[58] Field of Search .................. 328/133, 147, 149

[56] References Cited

U.S. PATENT DOCUMENTS 3,441,342  4/1969  Ball et al. .................. 328/134
3,588,710  6/1971  Masters .................. 328/133
3,750,035  7/1973  Crow .................. 328/133
4,199,799  4/1980  Ostenso et al. .................. 328/147

Primary Examiner—John S. Heyman
Attorney, Agent, or Firm—Horst M. Kasper

[57] ABSTRACT

A circuit is provided for producing a control voltage depending on a frequency and/or phase difference between a first and a second periodic signal. The periodic signals are fed to trigger circuits to provide trigger signals. An inhibiting time interval generator receives the trigger signals and produces inhibiting signals. The trigger signals are the inhibiting signals are fed to an inhibiting circuit which inhibits passage of trigger signals depending on the passage of recently passed trigger signals. A first flip-flop circuit is connected to the inhibiting circuit and the signals passed by the inhibiting circuit set and reset the flip-flop. The output of the first flip-flop is fed to an averaging circuit for generating an output control voltage. A comparator connected to the output of the averaging circuit compares the output control voltage with an average output control voltage and its output is connected to the inhibiting circuit. The circuit provides a definite control voltage such that a phase locked loop can operate automatically.

13 Claims, 5 Drawing Figures

CIRCUIT FOR PRODUCING A CONTROL VOLTAGE DEPENDING ON FREQUENCY AND/OR PHASE DIFFERENCES

DESCRIPTION

BACKGROUND OF THE INVENTION

1. Field of the Invention

The present invention relates to a circuit for generating a control voltage depending on a frequency and/or phase difference between a first periodic signal and a second periodic signal of arbitrary frequency where the first periodic signal produces a first trigger signal applied to a first input of a flip-flop for setting the flip-flop and where the second periodic signal produces a second trigger signal applied to a second input of the flip-flop for resetting the flip-flop.

2. Brief Description of the Background of the Invention Including Prior Art

Circuits set forth in the field of the invention are known as frequency and/or phase detectors, which in phase locked loops (PLL) provide the frequency or respectively phase comparison between a periodic input signal and the output signal of a voltage controlled oscillator serving as a reference signal. As an example for such frequency/phase detectors can be listed the integrated circuits MC 4344 or MC 4044 distributed by Motorola Corporation.

Such phase locked loop circuits are essentially noninductive, tunable, active filters with an adjustable band width. A phase locked loop in general comprises a voltage controlled oscillator, a phase detector and a loop filter. If the phase difference between the periodic signal from the voltage controlled oscillator and the input signal is constant, the phase loop is locked. If either the input or reference signal or the output of the voltage controlled oscillator change in phase, the phase detector and filter produce a D.C. error signal which is proportional in magnitude and polarity to the original phase change. This error voltage changes the voltage controlled oscillator phase so that it again locks into the reference signal. If a frequency divider is inserted in the feedback path of the phase locked loop between voltage controlled oscillator and phase detector then the output of the voltage controlled oscillator can be locked to some multiple of the reference frequency.

Frequency/phase detectors of the simplest kind have voltage/phase characteristic curves according to FIG. 2. The characteristic curves are periodic with a linear slope between the phase difference values $n \cdot 2\pi$ ($n = 0, \pm 1, \pm 2$). Such phase detectors operate without problem once in the controlled state. However, difficulties occur in trying to reach the controlled state. In addition, there is always the possibility that at phase differences too large jumps by $2\pi$ occur and the cycle slips.

SUMMARY OF THE INVENTION

1. Purposes of the Invention

It is an object of the invention to provide a circuit, which independent of the size of the frequency difference and of the phase between two periodic input signals, always produces a definite control voltage.

It is another object of the invention to produce a control voltage which controls a control circuit such that upon frequency equality of the periodic signals a phase difference of $\pi$ is formed.

It is a further object of the invention to provide for inhibiting of the second of closely coinciding trigger signals generated from the periodic signals.

These and other objects and advantages of the present invention will become evident from the description which follows.

2. Brief Description of the Invention

The present invention provides in one aspect a circuit for producing a control voltage depending on a frequency and/or phase difference between a first and a second periodic signal. A first trigger circuit receives the first periodic signal for providing a first trigger signal. A second trigger circuit receives a second periodic signal for providing a second trigger signal. An inhibiting circuit is connected to the output of the first trigger circuit and to the output of the second trigger circuit. An inhibiting time interval generator is connected to the output of the first trigger circuit and to the output of the second trigger circuit and has its own output connected to an input of the inhibiting circuit for providing to the inhibiting circuit first inhibiting signals and second inhibiting signals. A first flip-flop has two inputs connected to the inhibiting circuit via a first line for the first trigger signal to set the flip-flop and via a second line for the second trigger signal to reset the flip-flop. The input of an averaging circuit is connected to the output of the first flip-flop for generating an output control voltage. A comparator is connected to the output of the averaging circuit for comparing its output control voltage with an average output control voltage and having an output connected to an input of the inhibiting circuit for transmitting signals to the inhibiting circuit indicating if the output control voltage is larger or smaller than the average output control voltage.

Upon frequency equality of the first periodic signal and of the second periodic signal the output control voltage forms in each phase difference interval from 0 to $2\pi$ ($n \cdot 2\pi < \phi < (n+1) \cdot 2\pi$; $n = 0, 1, 2, 3, \ldots$) a continuous variable function of the phase difference with a certain average voltage value.

If the output control voltage is larger than the average output control voltage each second trigger signal can be suppressed by the inhibiting circuit in case such second signal did follow within a first inhibiting time interval to a first trigger signal. If the output control voltage is smaller than the average output control voltage, each first trigger signal, which follows within a second inhibiting time interval to a second trigger signal, can be suppressed by the inhibiting circuit.

The inhibiting time interval generator can comprise two mono-flops, the inhibiting circuit can comprise logical AND-gates and AND-NOT-gates, and the averaging circuit can be a low-pass filter. The mono-flops can generate signals with sweep times of constant duration or where the sweep time corresponds to a constant fraction of the period durations in each case.

Further, the inhibiting time interval generator can comprise a counter and a decoder coordinated to the counter, where the counter steps down by an integral number n a higher frequency auxiliary signal as compared with the other periodic signal and where the decoder in each case upon reading of predetermined counter states provides counting signals in each case. In addition to logical gates, the inhibiting circuit can comprise a second flip-flop which stores a time coincidence between a first trigger signal and a first inhibiting time interval determined by a first counting signal (n−1) and whereby the coordinated second trigger signal is inhibited as determined by the second counting signal (n) following immediately upon the first counting signal. The comparator can comprise a third flip-flop which, after it had been previously reset in each case, takes over the sweep state of the first flip-flop upon occurrence of a third counting signal (n/2).

According to a further aspect of the invention there is also provided a method for generating a control voltage depending on frequency and/or phase difference between a first periodic signal and a second periodic signal. A first trigger signal is generated from a first periodic signal in a first trigger circuit and a second trigger signal is generated from a second periodic signal in a second trigger circuit. A first inhibiting time interval signal is produced in an inhibiting time interval generator, which follows in time directly to the first trigger signal. A second inhibiting time interval signal is generated in an inhibiting time interval generator, which signal follows in time directly to the second trigger signal. The inhibiting time interval signals and the trigger signals are fed to an inhibiting circuit. A first flip-flop is set with an output signal of the inhibiting circuit corresponding to a first trigger signal and the first flip-flop is reset with an output signal of the inhibiting circuit corresponding to a second trigger signal. The output of the first flip-flop is averaged in an averaging circuit to provide an output control voltage. The output control voltage is compared with an average output control voltage in a comparator for providing a control signal to the inhibiting circuit.

Every second trigger signal which follows in time within a first inhibiting time interval to the first trigger signal can be suppressed in case the output control voltage is larger than the average output control voltage. Every first trigger signal which follows in time within a second inhibiting time interval to the second trigger signal can be suppressed in case the output control voltage is smaller than the average output control voltage.

The averaging can be provided by a low-pass filter. The inhibiting time intervals can be produced by a counter and a decoder corresponding to the counter, where the counter steps down by a factor of n a higher frequency auxiliary signal and where the decoder in each case upon reaching of predetermined counter states puts out coordinated counter signals. A time coincidence between the first trigger signal and the first inhibiting time interval determined by a first counter signal (n−1) can be stored in a second flip-flop, whereby the second trigger signal determined by a second counter signal (n) following immediately upon a first counter signal (n−1) is inhibited. The comparator can comprise a third flip-flop, which flip-flop after having been reset and upon occurrence of a third counter signal (n/2) takes over the sweep state of the first flip-flop.

A voltage dependent oscillator can be controlled with the output control voltage such that the frequency of the first periodic signal generated by the oscillator approximates the frequency of the second periodic signal and at frequency equality a phase difference of $\pi$ results between the first periodic signal and the second periodic signal.

The circuit according to the present invention always provides a definite control voltage such that a phase locked loop can operate automatically. This results in the additional advantage that upon frequency equality the region within which phase differences do not effect a cycle slip is larger than $2\pi$.

The novel features, which are considered as characteristic for the invention, are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENTS

Figure 1:
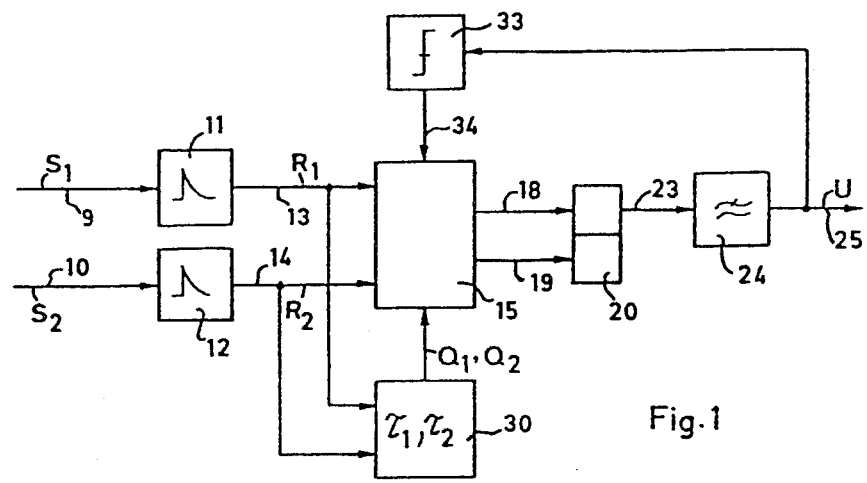
FIG. 1 is a view of a circuit block diagram representing a general circuit according to the invention.

In accordance with the present invention there is provided a circuit arrangement for generation of a control voltage U depending on a frequency or phase difference $\phi$ between a first $S_1$ and a second $S_2$ periodic signal of arbitrary frequency, which comprises a flip-flop 20, one input 18 of which received the first periodic signal $S_1$ via a first trigger circuit 11 providing at each of its periods a first trigger signal $R_1$ for setting the flip-flop and a second input 19 of which received the second periodic signal $S_2$ via a second trigger circuit 12 providing at each of its periods a second trigger signal $R_2$ for resetting of the flip-flop 20. An averaging circuit 24 for providing a control voltage U follows to the flip-flop 20. The control voltage U forms a continuous, variable function of the phase difference $\phi$ with an average value $U_o$ in each phase difference interval from 0 to $2\pi$ ($n \cdot 2\pi < \phi < (n+1) \cdot 2\pi$; n=0, 1, 2, 3, . . . ) upon frequency equality.

A comparator 33 is coordinated to the flip-flop 20 and provides at its output 34 control signals which indicate if the output control voltage U is larger or smaller than the average output control voltage $U_o$. An inhibiting time interval generator 30 is coordinated to the trigger circuit 11, 12, which generator provides immediately adjacent to the trigger signals $R_1$, $R_2$ a first $\tau_1$ and second $\tau_2$ inhibiting interval. An inhibiting circuit 15 is inserted between the first 11 and second 12 trigger circuit and the flip-flop 20. If the output control voltage U is larger than the average output control voltage $U_o$, then each second $R_2$ trigger signal is suppressed which follows within a first inhibiting interval $\tau_1$ in time to a first trigger signal. If the output control voltage U is smaller than the average output control voltage $U_o$, then each first trigger signal $R_1$ is suppressed, which follows within a second inhibiting interval $\tau_2$ in time to a second trigger signal $R_2$.

The inhibiting time interval generator 30 can comprise two monoflops 31, 32, which can either generate sweep times of constant duration or sweep times corresponding to a constant fraction of the period duration in each case. The inhibiting circuit 15 can comprise logic AND-gates 16, 17 and AND-NOT-gates 21, 22 and the averaging circuit 24 can be a low-pass circuit.

The inhibiting time interval generator 30 can comprise a counter 50 and a decoder 51 coordinated to the counter 50, where the counter 50 steps down an auxiliary signal $s_2$ by a factor n, the signal $s_2$ being of a higher frequency by an integer factor n relative to the periodic signal $S_2$ and the decoder provides coordinated counting signals in each case upon reaching of predetermined counter states.

Figure 5:
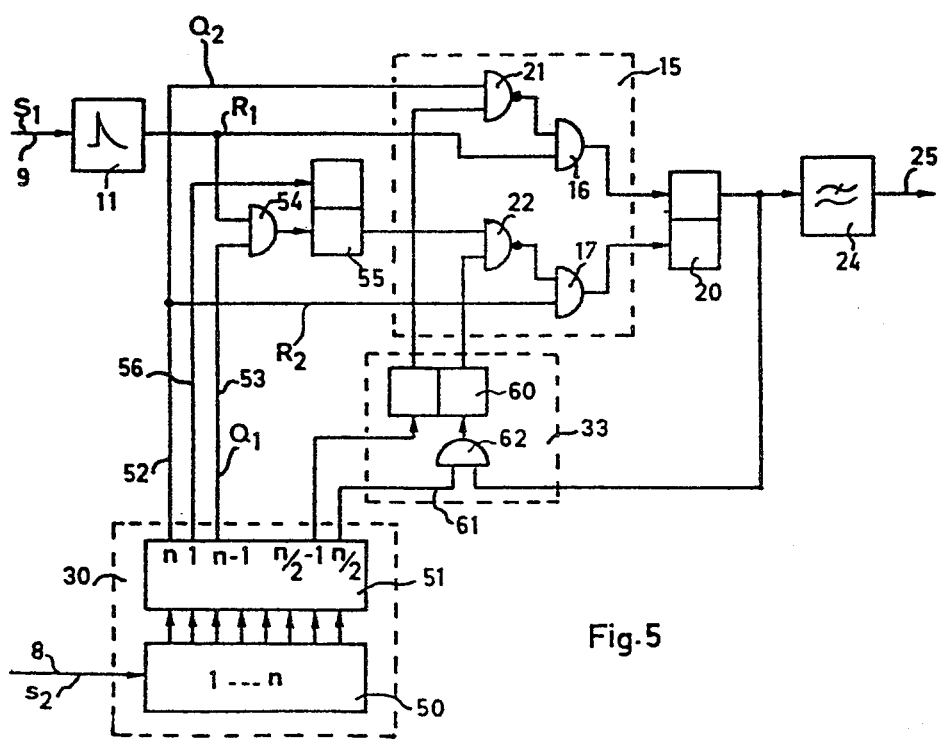
FIG. 5 is a view of a further circuit block diagram representing a different embodiment.

The inhibiting circuit 15 in addition to logical gates may also comprise a second flip-flop 55, which stores a time coincidence between a first trigger signal $R_1$ and a first inhibiting time interval $\tau_1$ determined by a first trigger signal $R_1$ and thereby inhibits the coordinated second trigger signal $R_2$, which is determined by the second counting signal n following immediately upon the first counting signal. The comparator 33 can comprise a third flip-flop 60, which after having been reset previously in each case can take over the flipping state of the first flip-flop 20 upon occurrence of a third counting signal (n/2) as shown in FIG. 5.

Referring now to FIG. 1 there is shown a circuit block diagram in principle of the invention circuit for generating of a control voltage depending on a frequency and/or phase difference. The inputs of the circuit are designated as 9 and 10 via which two periodic input signals $S_1$, $S_2$ to be compared and of arbitrary frequency are entered. 11 and 12 represent trigger circuits, which derive from the input signals during each period a short trigger signal. For example, if the input signals are rectangular signals, than the circuits 11 and 12 can be differentiating circuits, which generate trigger pulses from the signal rise slopes. In case the input signals are sinusoidal signals, then threshold detectors can be provided as a Schmitt-trigger circuit, which gives short pulses upon being activated.

The inputs 18 and 19 of the flip-flop 20 are connected to the outputs 13 or respectively 14 of the trigger circuits 11 or respectively 12 via an inhibiting circuit 15. The trigger signals arriving via the inputs 18 or respectively 19 serve to set or respectively reset the flip-flop 20. Thereby a sequence of rectangular pulses is generated at the output 23 of the flip-flop, the on- and off-times or the duty cycle of which depend on the difference of the frequencies of the input signals or respectively on the phase difference $\phi$ of the trigger signals at the flip-flop inputs. 24 designates an averaging circuit such as for example a low-pass circuit, which puts out the output control D.C. voltage U, which corresponds to the time average of the on and off times of the flip-flop 20.

Figure 2:
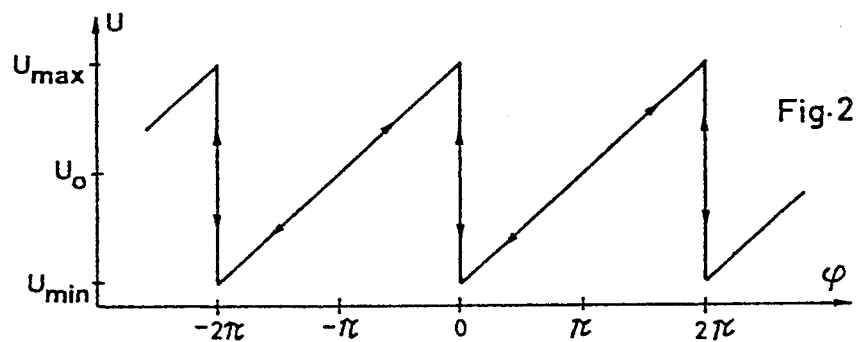
FIG. 2 is a view of a first voltage/phase difference diagram.

Apart from the inhibiting circuitry the circuit described above corresponds to a conventional frequency/phase detector, which puts out a control voltage U at its output 25, which control voltage is according to FIG. 2 connected like a sawtooth to the phase difference $\phi$. Periodically repeating linear regions extend in each case over a phase region of $2\pi$. A jump from $U_{max}$ to $U_{min}$ and vice versa occurs at the points $\phi = n \cdot 2\pi$ ($n = 0, \pm 1, \pm 2, \pm 3 \ldots$). Thus a jump free phase control is only possible within a phase difference region of $2\pi$. In each case at $\phi = (2n-1) \cdot \pi$ the control voltage U is equal to an average voltage value $U_o$, which corresponds to equal on- and off-times.

If the frequencies of the input signals are different, then no constant time or phase differences occur within the periods of $2\pi$ between the trigger signals involved. In this case no D.C. voltage U forms at the output 25 and the value of U does not signal a definite control direction. Thus the voltage U cannot be employed for control purposes.

Figure 3:
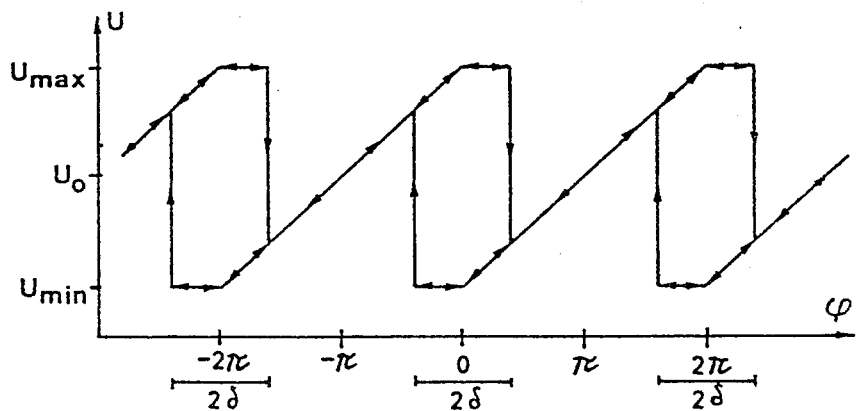
FIG. 3 is a view of a second voltage/phase difference diagram.

FIG. 3 shows a D.C. voltage/phase difference diagram, which does not have this disadvantage. The diagram shows a hysteresis-like splitting in the phase difference regions of $\phi = n \cdot 2\pi \pm \delta$ ($n = 0, \pm 1, \pm 2 \ldots$). The individual branches of the curves can be run through according to the directions of the arrows shown. A circuit with such a characteristic produces always a definite frequency or phase control voltage.

The addition of the units 15, 30 and 33 in accordance with the present invention to the known frequency/phase detector results in a circuit having a characteristic corresponding to the characteristic shown in FIG. 3. 30 designates an inhibiting time interval generator, which directly joining in time to the trigger signals $R_1$ and $R_2$ generates inhibiting time interval signals $Q_1$ and $Q_2$ of the lengths $\tau_1$ or respectively $\tau_2$. 33 represents a comparator providing an indicating signal if the output control voltage U is larger or smaller than the average output control voltage $U_o$. The above mentioned inhibiting circuit 15 finally blocks the trigger pulses $R_1$ and $R_2$ based on the signals coming from the recited units 30 and 33 according to the following rules:

If the output control voltage U is smaller than $U_o$ and a first trigger pulse $R_1$ falls into a inhibiting time interval $\tau_2$ following to a second trigger pulse $R_2$, then this trigger pulse $R_1$ is blocked.

If the output control voltage U is larger than $U_o$ and a second trigger pulse $R_2$ falls into an inhibiting time interval $\tau_1$ following to a first trigger pulse $R_1$, then this trigger pulse $R_2$ is blocked.

The circuit operates as follows: Trigger signals $R_1$ or respectively $R_2$ are derived from the periodic input signals $S_1$ and $S_2$ via the trigger circuits 11 and 12. Inhibiting signals $Q_1$ and $Q_2$ are released by the trigger signals in the inhibiting time interval generator 30, which result in blocking the signals on the lines 18 or respectively 19 for times $\tau_1$ or respectively $\tau_2$, if the comparator 33 allows this based on its momentary output signal. If thus the interval between the trigger pulses on the lines 13 and 14 is smaller than $\tau_1$ or $\tau_2$, then in this case the trigger pulse occurring later in time is blocked and the flip-flop 20, which had been set by the trigger pulse earlier in time, is now not reset, but remains in its state. Thereby a changed rectangular signal results at the output 23 of the flip-flop or possibly for times a continuous signal results with a corresponding change of the output control voltage U at the output 25.

Figure 4:
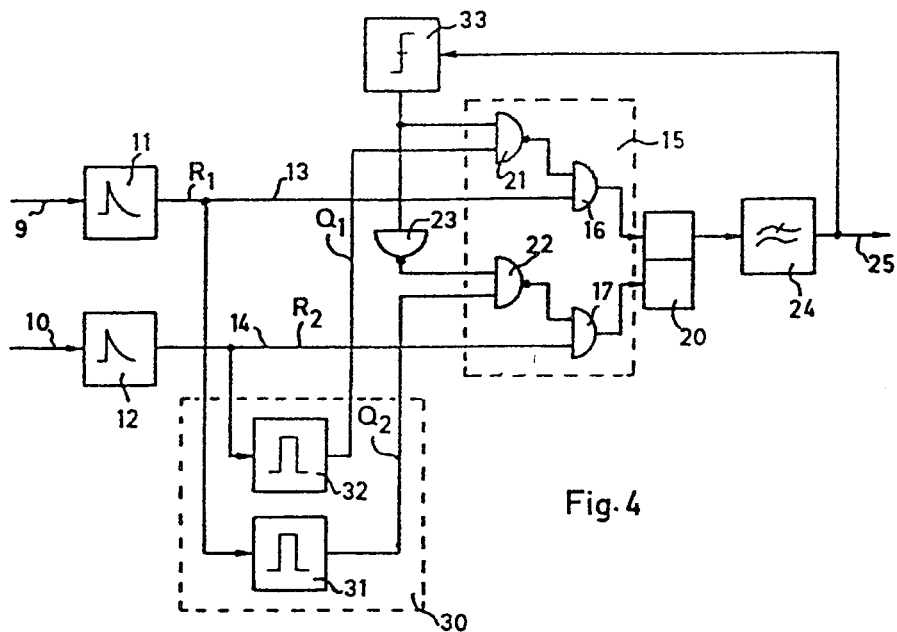
FIG. 4 is a view of a more detailed circuit block diagram of a circuit according to the invention.

FIG. 4 shows a more detailed circuit block diagram of the invention circuit. In this case the inhibiting time interval generator 30 is formed by two mono-flops 31 and 32, which after being triggered by the trigger signals $R_1$ or respectively $R_2$ provide rectangular inhibiting signals of constant length $\tau_1$ and $\tau_2$. These signals are fed to two combinations of AND-NOT-gates 21, 22 and AND-gates 16, 17, which form the inhibiting circuit 15. A voltage comparator provides the comparator 33 and the voltage comparator is connected to the output 25. It provides its non-inverted output signal to the gate 21 and its output signal is inverted in an inverter 23 and then fed to the gate 22.

FIG. 5 shows a further circuit block diagram with an inhibiting time interval generator 30, where the time duration of the inhibiting time intervals $\tau_1$ and $\tau_2$ is a constant fraction of the signal period in each case independent from the frequency of the input signal $S_2$. $s_2$ is an auxiliary signal, which is applied at the input 8 and which has a frequency which is higher by a factor n as compared with the frequency of the signal $S_2$. The auxiliary signal $s_2$ is stepped down by a factor n in the counter 50. 51 represents a decoder which in case the counter 50 reaches certain counting values responds in each case during a time interval duration of 1/n and then in each case feeds a signal of a corresponding length to a separate line.

The inhibiting signal $Q_2$ appears at the counting state n on the line 52 and the inhibiting signal 52 is fed to the AND-NOT-gate 21 as an inhibiting time interval $\tau_2$ and to the AND-gate 17 as a trigger signal $R_2$. At the counter state $n-1$ the inhibiting signal $Q_1$ appears on the line 53 and the inhibiting signal $Q_1$ sets via an AND-gate 54 a flip-flop 55 upon coincidence with a trigger signal $R_1$. At a counter state $n+1$, which corresponds to the counter state of 1 of the next counting period, the flip-flop 55 is reset via line 56.

60 is an additional flip-flop, which serves to indicate how the relative on- and off-times or the duty cycle of the flip-flop 20 is distributed. It thus replaces the comparator 33. The flip-flop 60 is set corresponding to the position of the flip-flop 20 via an AND-gate 62 upon reaching of the counter state n/2 by way of a needle pulse fed to the line 61 or respectively is not set. At the counter state n/2−1 the flip-flop 60 is reset in each case. The other parts of the circuit correspond to those shown in FIGS. 1 and 4.

The circuit for generating of a control voltage depending on a frequency or phase difference can be employed as a frequency/phase detector in phase locked loops. In case of the latter situation an auxiliary signal $s_2$ can be generated very simple with a voltage controlled oscillator, which oscillates at a frequency, which is by a constant integer factor n higher than the desired signal frequency $S_2$.

The phase locked loop is controlled in each case such that the frequency of the signal (for example $S_1$) generated by the voltage controlled oscillator approximates the frequency of the second signal $S_2$ and upon equality of the frequencies a phase difference of $\phi=\pi$ is obtained.

Thus a phase locked loop can comprise a frequency phase detector, a filter and a voltage controlled oscillator where at the filter output 25 an output control voltage U is generated, which controls the voltage dependent oscillator such that the frequency of the first signal $S_1$ generated by the oscillator approaches the frequency of the second signal $S_2$.

It will be understood that each of the elements described above, or two or more together, may also find a useful application in other types of signal system configurations and wave or pulse processing procedures differing from the types described above.

While the invention has been illustrated and described as embodied in the context of a phase locked loop circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A circuit for producing a control voltage depending on a frequency and/or phase difference between a first and a second periodic signal comprising:
   a first trigger circuit receiving the first periodic signal for providing a first trigger signal;
   a second trigger circuit receiving the second periodic signal for providing a second trigger signal;
   an inhibiting circuit connected to the output of the first trigger circuit and to the output of the second trigger circuit;
   an inhibiting time interval generator connected to the output of the first trigger circuit and to the output of the second trigger circuit and having its own output connected to an input of the inhibiting circuit for providing to the inhibiting circuit first inhibiting signals and second inhibiting signals;
   a first flip-flop having two inputs connected to the inhibiting circuit via a first line for the first trigger signal to set the flip-flop and via a second line for the second trigger signal to reset the flip-flop;
   an averaging circuit having its input connected to the output of the flip-flop for generating an output control voltage; and
   a comparator connected to the output of the averaging circuit for comparing its output control voltage with an average output control voltage and having an output connected to an input of the inhibiting circuit for transmitting signals to the inhibiting circuit indicating if the output control voltage is larger or smaller than the average output control voltage.

2. The circuit for producing a control voltage according to claim 1 wherein upon frequency equality of the first periodic signal and of the second periodic signal the output control voltage forms in each phase difference interval from 0 to $2\pi$ ($n\cdot 2\pi <\phi <(n+1)\cdot 2\pi$; n=0,1,2,3, ...) a continuous variable function of the phase difference with a certain average voltage value.

3. The circuit for producing a control voltage according to claim 1 where for an output control voltage larger than the average output control voltage each second trigger signal is suppressed by the inhibiting circuit, which second signal followed within a first inhibiting time interval to a first trigger signal; and where for an output control voltage smaller than the average output control voltage each first trigger signal, which followed within a second inhibiting time interval to a second trigger signal, is suppressed by the inhibiting circuit.

4. The circuit for producing a control voltage according to claim 1 wherein
   the inhibiting time interval generator comprises a counter and a decoder coordinated to the counter, where the counter steps down by an integral number n a higher frequency auxiliary signal as compared with the other periodic signal, and where the decoder in each case upon reaching of predetermined counter states provides counting signals in each case.

5. The circuit for producing a control voltage according to claim 1 wherein the inhibiting time interval generator comprises two mono-flops, wherein the inhibiting circuit comprises logical AND-gates and AND- NOT-gates, and wherein the averaging circuit is a low pass circuit.

6. The circuit for producing a control voltage according to claim 1 wherein the mono-flops generate signals with sweep times of constant durations.

7. The circuit for producing a control voltage according to claim 1 wherein the mono-flops generate signals with sweep times corresponding to a constant fraction of the period durations in each case.

8. The circuit for producing a control voltage according to claim 1 wherein:

the inhibiting time interval generator comprises a counter and a decoder coordinated to the counter, where the counter steps down by an integral number n a higher frequency auxiliary signal as compared with the other periodic signal, and where the decoder in each case upon reaching of predetermined counter states provides counting signals in each case, where the inhibiting circuit comprises:
in addition to logical gates a second flip-flop which stores a time coincidence between a first trigger signal and a first inhibiting time interval determined by a first counting signal (n−1) and whereby the coordinated second trigger signal is inhibited determined by the second counting signal (n) following immediately upon the first counting signal, and where the comparator comprises a third flip-flop which, after it had been previously reset in each case takes over the sweep state of the first flip-flop upon occurrence of a third counting signal (n/2).

9. A method for generating a control voltage depending on a frequency and/or phase difference between a first periodic signal and a second periodic signal comprising:

generating a first trigger signal from a first periodic signal in a first trigger circuit;

generating a second trigger signal from a second periodic signal in a second trigger circuit;

producing a first inhibiting time interval signal in an inhibiting time interval generator, which follows in time directly to the first trigger signal;

producing a second inhibiting time interval signal in an inhibiting time interval generator, which follows in time directly to the second trigger signal;

feeding the inhibiting time interval signals and the trigger signals to an inhibiting circuit;

setting a first flip-flop with an output signal of the inhibiting circuit corresponding to a first trigger signal;

resetting the first flip-flop with an output signal of the inhibiting circuit corresponding to a second trigger signal;

averaging the output of the first flip-flop in an averaging circuit providing an output control voltage;

comparing the output control voltage in a comparator with an average output control voltage for providing a control signal to the inhibiting circuit.

10. The method for generating a control voltage according to claim 9 further comprising:

suppressing every second trigger signal which follows in time within a first inhibiting time interval to the first trigger signal in case the output control voltage is larger than the average output control voltage; and suppressing every first trigger signal which follows in time within a second inhibiting time interval to the second trigger signal in case the output control voltage is smaller than the average output control voltage.

11. The method for generating a control voltage according to claim 9 wherein the averaging is provided by a low-pass filter.

12. The method for generating a control voltage according to claim 9 wherein the inhibiting time intervals are produced by a counter and a decoder corresponding to the counter, where the counter steps down by a factor of n a higher frequency auxiliary signal and where the decoder in each case upon reaching of predetermined counter states puts out coordinated counter signals;

further comprising storing a time coincidence between the first trigger signal and a first inhibiting time interval determined by a first counter signal (n−1) in a second flip-flop and whereby the second trigger signal determined by a second counter signal (n) following immediately upon a first counter signal (n−1) is inhibited; and where a third flip-flop is part of the comparator which upon having been reset and upon occurrence of a third counter signal (n/2) takes over the sweep state of the first flip-flop.

13. The method for generating a control voltage according to claim 9 further comprising:

controlling a voltage dependent oscillator with the output control voltage such that the frequency of the first periodic signal generated by the oscillator approximates the frequency of the second periodic signal and where at frequency equality a phase difference of $\pi$ results between the first periodic signal and the second periodic signal.

* * * * *